US008974857B2

(12) United States Patent
Yoon et al.

(10) Patent No.: US 8,974,857 B2
(45) Date of Patent: Mar. 10, 2015

(54) METHODS FOR MANUFACTURING OF COBALT BORIDE COATING LAYER ON SURFACE OF STEELS BY USING A PACK CEMENTATION PROCESS

(71) Applicant: Korea Institute of Science and Technology, Seoul (KR)

(72) Inventors: Jin Kook Yoon, Seoul (KR); Jung Man Doh, Seoul (KR); Sang Whan Park, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 198 days.

(21) Appl. No.: 13/675,136

(22) Filed: Nov. 13, 2012

(65) Prior Publication Data

US 2013/0260160 A1 Oct. 3, 2013

(30) Foreign Application Priority Data

Mar. 30, 2012 (KR) ........................ 10-2012-0033004

(51) Int. Cl.

| | |
|---|---|
| ***C23C 10/34*** | (2006.01) |
| ***C23C 16/38*** | (2006.01) |
| ***B05D 7/14*** | (2006.01) |
| ***C23C 8/80*** | (2006.01) |
| ***C23C 8/02*** | (2006.01) |
| ***C23C 8/70*** | (2006.01) |
| ***C23C 10/02*** | (2006.01) |
| ***C23C 10/08*** | (2006.01) |
| ***C23C 10/60*** | (2006.01) |

(52) U.S. Cl.

CPC ... *B05D 7/14* (2013.01); *C23C 8/80* (2013.01); *C23C 8/02* (2013.01); *C23C 8/70* (2013.01); *C23C 10/02* (2013.01); *C23C 10/08* (2013.01); *C23C 10/60* (2013.01)

USPC ............... 427/255.31; 427/255.38; 427/255.7

(58) Field of Classification Search

CPC ................................ C23C 10/34; C23C 16/38

USPC ............................. 427/255.31, 255.38, 255.7

See application file for complete search history.

(56) References Cited

U.S. PATENT DOCUMENTS

| | | | | |
|---|---|---|---|---|
| 3,930,575 | A * | 1/1976 | Komatsu et al. | 205/230 |
| 4,115,156 | A * | 9/1978 | Straumann | 148/279 |
| 4,160,854 | A * | 7/1979 | D'Silva | 36/166 |
| 4,402,764 | A * | 9/1983 | Clark et al. | 148/247 |
| 4,942,062 | A * | 7/1990 | Ducarroir et al. | 427/249.5 |
| 4,971,624 | A * | 11/1990 | Clark et al. | 75/238 |
| 2002/0125125 | A1* | 9/2002 | Rapp | 204/243.1 |
| 2009/0208637 | A1* | 8/2009 | Chen et al. | 427/78 |
| 2010/0075063 | A1* | 3/2010 | Bai et al. | 427/540 |
| 2012/0049966 | A1* | 3/2012 | Pi et al. | 331/94.1 |

FOREIGN PATENT DOCUMENTS

| | | | |
|---|---|---|---|
| CH | 623184 A3 | * | 12/1978 |
| JP | 5-331721 | * | 12/1993 |
| KR | 1020110004973 A | | 1/2011 |

OTHER PUBLICATIONS

Liu, Y.Q., et al., "Thermodynamic optimization of the boron—cobalt—iron system". Journal of Alloys and Compounds, 509 (2011) 4805-4810.*

Rinaldi, Antonio, et al., "Radial Inner Morphology Effects on the Mechanical Properties of Amorphous Composite Cobalt Boride Nanoparticles". J. Phys. Chem. C 2010, 114, 13451-13458.*

Campos-Silva, I., et al., "The boriding process in CoCrMo alloy: Fracture toughness in cobalt boride coatings". Surface & Coatings Technology, (2014), http://dx.doi.org/10.1016/j.surfcoat.2014.07.092. pp. 1-7.*

Long, Jianguo, et al., "Analysis of hysteretic behavior in a FeCoB-based nanocrystalline alloy by a Preisach distribution and electron holography". Journal of Applied Physics 103, 07E710 (2008), pp. 1-4.*

Livingston, L.D., et al., "Magnetic domains in cobalt and iron borides". J. Appl. Phys. 52 (3), Mar. 1981, pp. 2506-2508.*

Raghavan, V., "B—Co—Fe (Boron—Cobalt—Iron) Section II: Phase Diagram Evaluations". Journal of Phase Equilibria and Diffusion, vol. 33 No. 5 2012, pp. 392-394.*

* cited by examiner

*Primary Examiner* — Bret Chen

(74) *Attorney, Agent, or Firm* — Ladas & Parry LLP

(57) ABSTRACT

Disclosed is to a method for manufacturing a cobalt boride coating layer on the surface of iron-based metals by using a pack cementation process. In particular, the present invention relates to a method for manufacturing a cobalt boride coating layer by forming a composite coating layer on the surface of steels which is composed of an outmost layer having a composition of cobalt boride ($Co_2B$) and an inner layer having a composition of iron-cobalt boride ($(Fe,Co)_2B$). Since the cobalt boride coating layer is a compact coating layer having little defects such as pores, it can improve physical properties such as corrosion resistance, wear resistance and oxidation resistance of steels.

8 Claims, 6 Drawing Sheets

METHODS FOR MANUFACTURING OF COBALT BORIDE COATING LAYER ON SURFACE OF STEELS BY USING A PACK CEMENTATION PROCESS

CROSS-REFERENCE TO RELATED APPLICATION

This application claims under 35 U.S.C. §119(a) the benefit of Korean Patent Application No. 10-2012-0033004 filed Mar. 30, 2012, the entire contents of which are incorporated herein by reference.

FIELD OF THE INVENTION

The present invention relates to a method for manufacturing a cobalt boride coating layer on the surface of iron-based metals by using a pack cementation process. In particular, the present invention relates to a method for manufacturing a cobalt boride coating layer by forming a composite coating layer on the surface of steels which is composed of a outmost layer of cobalt boride ($Co_2B$) and an inner layer of iron-cobalt boride ($(Fe,Co)_2B$). Since the cobalt boride coating layer prepared according to the method of the present invention is a compact coating layer having little defects such as pores, it can improve physical properties such as corrosion resistance, wear resistance and oxidation resistance of steels.

BACKGROUND

An integrated gasification combined cycle (IGCC) is divided into two parts, that is, a gas generator for generating synthetic gas by using fossil fuel such as coal and petroleum including ASU, a gasifier, a heat recovery apparatus, solid particle and sulfur removing apparatus and the like as, and a gas turbine for generating electricity by burning thus generated synthetic gas.

In case of a gasifier for generating syngas by using fossil fuel such as coal and petroleum, for the protection of the gasifier from high heat, the inside thereof should be made of ceramic materials with excellent heat resistance. It is required to use materials with good heat resistance and wear resistance for an exchanger where gas with high temperature around 1500° C. (1250~1600° C.) generated at the gasifier is passed through, materials with high wear resistance and corrosion resistance to gas for an impurity removing apparatus, materials with excellent corrosion resistance to sulfuric acid at low temperature for a sulfur removing apparatus, and thermal shield materials with low thermoconductivity for a gas turbine where a moisture content in waste gas is high and it shows high thermoconductivity.

In particular, among the parts of the integrated gasification combined cycle, a heat exchanger, a filter, a turbine and other iron-based metal parts should have strong resistance to high temperature and significant difference in pressure. Further, these parts are exposed to corrosive gas and numerous particles that wear off the materials and deteriorate their function, which results in significantly decreasing life span of the parts.

Therefore, there have been several studies in surface coating techniques that are capable of remarkably increasing life span of the parts by coating the surface of the metal parts with a material having high corrosion resistance and wear resistance.

As a material for the parts such a heat exchanger and a filter, stainless alloys (SS 304, SS 405, SS 410 and the like) and nickel alloys (HR 160, Incoloy 800, etc.) have been widely used. Especially, the nickel alloys are very expensive as compared with the stainless alloys. Therefore, there is a need to develop a surface coating method which employs inexpensive metal materials rather than conventionally used expensive metal materials and forms a coating layer with high corrosion resistance and wear resistance at the surface thereof, which makes it possible to use under severe corrosive environment.

In order to improve corrosion resistance and wear resistance of the metal material, there have been many studies in techniques of forming a coating layer by using metal borides such as iron boride ($FeB$, $Fe_2B$), nickel boride ($Ni_2B$, $Ni_3B$) and cobalt boride ($CoB$, $Co_2B$) at the surface of a material. Among these metal borides, because cobalt boride has many functional properties, there have been several attempts to apply it to various industrial fields.

Cobalt boride has been widely used as a catalyst in the field of hydrogen storage and fuel cell technology due to its excellent electrochemical properties, and applied to a wear- and corrosion-resistant coating layer due to its high hardness and excellent oxidation resistance. Further, there are numerous attempts to apply cobalt boride to the fields of biomedical and drug delivery system.

In addition, iron-based parts that have been used in the production of non-ferrous metals (aluminum, zinc and the like) by using a casting method react with melted non-ferrous metals, which results in forming brittle intermetallic compounds, leading to a drastic reduction in life span of the parts.

To solve these problems, Korean Patent Application Publication No. 2011-0004973 discloses a method of improving life span of a metal part used for non-ferrous metal casting, comprising forming cobalt boride at the surface of the metal part by boronizing treatment of expensive cobalt-based alloys, comprising 13~74.4% of Co, 0.1~3% of C, 15~35% of Cr, 5~30% of Mo, 0.5~4% of Si, and 5~15% of W.

Further, it has been reported that in order to provide wear resistance to the surface of a steel part or copper with high electroconductivity, it is electroplated with cobalt by using an electroplating method, followed by boronizing, to thereby form cobalt boride, which makes it possible to improve wear resistance of the surface.

Thus, cobalt boride has been known as a coating layer having good physical properties which is capable of enhancing corrosion resistance and wear resistance at the surface of a metal part. In order to form a cobalt boride coating layer at the surface of an iron-based part, the two-step surface treatment in which the surface of a material is plated with cobalt by using an electroplating method and subjected to boronization is required. However, such a two-step process is very complicated and its effect on the improvement in physical properties is not enough.

In particular, it is very difficult to uniformly coat the surface of a heat exchanger, a filter, a turbine and other iron-based parts having a complicated configuration among the parts of an integrated gasification combined cycle by using an electroplating method.

SUMMARY OF THE INVENTION

The present inventors have therefore endeavored to overcome the above problems and found that when a pack cementation process which is economical, is not required to use an expensive coating apparatus and is able to easily coat a part having a complicated configuration is used, it is possible to simply form a cobalt boride coating layer with good physical properties such as corrosion resistance, wear resistance and oxidation resistance.

It is an object of the present invention to provide a method for forming a cobalt boride coating layer on the surface of iron-based metals by using a pack cementation process.

It is another object of the present invention to provide an iron-based metal part with improved durability whose surface is coated with a composite coating layer, the composite coating layer being composed of an outmost layer having a composition of cobalt boride and an inner layer having a composition of iron-cobalt boride.

In order to achieve the above objects, the present invention provides a method for forming a cobalt boride coating layer on the surface of iron-based metals, comprising the steps of:

forming a thin layer composed of iron borides on the surface of iron-based metals by using a pack cementation process;

forming a layer composed of cobalt-iron on the surface of iron-based metals by using a pack cementation process on the iron borides; and forming an outmost layer composed of cobalt boride and an inner layer composed of iron-cobalt boride by using a pack cementation process on the cobalt-iron layer.

Effect of the Invention

According to the method of the present invention for forming a coating layer by using a pack cementation process, a coating layer is manufactured by a simple and economical process, and there is an advantage of manufacturing a coating layer having increased interface binding strength between a basic material and a coating layer.

Thus, it is possible to form a cobalt boride coating layer with superior corrosion resistance and wear resistance due to a fine compact structure of the coating layer formed on the surface of iron-based metals where there is little defect such as pores inside thereof.

Further, in case of forming a Co—Fe alloy layer by depositing cobalt on the surface of iron-based metals by using a pack cementation process according to the present invention, it is possible to form a Fe—Co alloy coating layer having a fine composite structure by suppressing a substitution reaction with Fe during the cobalt deposition.

Therefore, an iron-based metal part on which the cobalt boride coating layer is formed according to the method of the present invention exhibits excellent physical properties such as corrosion resistance, wear resistance and oxidation resistance, which significantly increases the life span thereof.

In addition, since the method of the present invention is relatively simple, the coating layer can be economically formed.

BRIEF DESCRIPTION OF THE DRAWINGS

The above and other features of the present invention will now be described in detail with reference to certain exemplary embodiments thereof illustrated the accompanying drawings which are given herein below by way of illustration only, and thus are not limitative of the present invention, and wherein.

DETAILED DESCRIPTION OF THE INVENTION

Hereinafter, the present invention will be described in more detail.

In order to improve corrosion resistance and wear resistance of a heat exchanger, a filter, a turbine and other metal parts among them of an integrated gasification combined cycle, the present invention provides a method for forming a coating layer having a composition of cobalt boride and having little defect such as pores by using a pack cementation process.

The method for forming a coating layer according to the present invention is characterized by forming a thin layer having a composition of iron borides (FeB, $Fe_2B$) on the surface of iron-based metal by using a pack cementation process for a short period of time, and forming a layer having a composition of cobalt-iron alloy with little defect such as pores by deposition of cobalt on the surface of iron borides using a pack cementation process, and finally forming an outmost dense layer having a composition of cobalt boride on the surface of the iron-based metal.

The cobalt pack powder for coating the surface of an iron-based metal part by using a pack cementation process according to the present invention can comprise pure cobalt powder as a source of Co, $NH_4Cl$ powder which functions as an activator to deliver cobalt close to the surface of an iron-based part, and stabilizing powder such as $Al_2O_3$ which prevents the above powders from being sintered, which results in maintaining pores inside of the pack powder, and thus facilitating the movement of reacting gas to the surface of a basic material.

As a cobalt pack powder for coating according to the present invention, it is preferable to use a cobalt pack powder composed of 2~60 wt % of cobalt powder, 1~10 wt % of $NH_4Cl$ powder and 30~97 wt % of $Al_2O_3$ powder.

However, it is thermodynamically difficult to coating the surface of an iron-based part with cobalt by using a pack cementation process.

Figure 1:
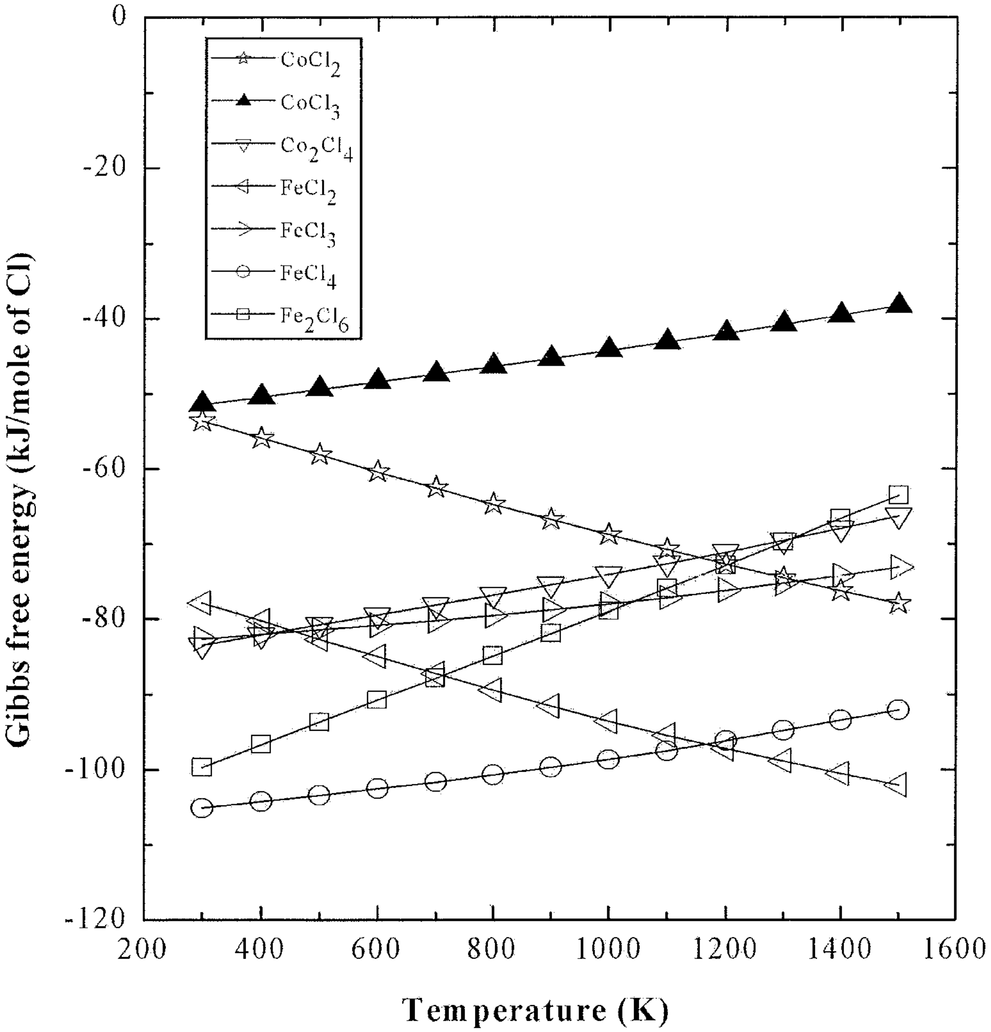
FIG. 1 is a graph showing the change in Gibbs free energy depending on temperature with respect to reacting gas of cobalt chloride and resulting gas of iron chloride in Example of the present invention.

FIG. 1 is the result of showing the change in Gibbs free energy of various reacting gases generated inside the pack powder and at the surface of an iron-based part depending on coating temperature.

After the cobalt powder is prepared by mixing cobalt powder, $NH_4Cl$ powder and $Al_2O_3$ powder in the range of amount as described above, the iron-based metal basic material is charged into the inside of the cobalt pack powder, followed by heating to a high temperature ranging from 600~1100° C. under hydrogen or inert gas atmosphere. At this time, the cobalt powder reacts with $NH_4Cl$ to generate cobalt-containing reacting gas such as $CoCl_2$, $CoCl_3$, $Co_2Cl_4$ and the like.

These reacting gases move to the surface of the iron-based metal basic material, and then cobalt is deposited thereon.

When cobalt is deposited on the surface of the iron-based metal basic material, Fe-based resulting gas such as $FeCl_2$, $FeCl_3$, $FeCl_4$ or $Fe_2Cl_6$ are generated and released by the reaction of Fe included in the basic material. Here, because Gibbs free energy of the iron-based resulting gas being generated is lower than that of the cobalt-containing reacting gas. Thus, when cobalt is deposited by substitution with Fe of the basic material, a compact Co—Fe alloy layer is not formed on the surface of the basic material due to such Fe-based resulting gas, and instead a porous Co—Fe alloy layer is formed.

Therefore, if a porous Co—Fe alloy layer is formed and boronized by using a pack cementation process, a porous $Co_2B$ coating layer is formed, leading to the remarkable decrease in hardness and wear resistance. Further, because of the increase in surface area due to the formation of pores, there is a problem of decreasing corrosion resistance.

Thus, when a cobalt boride coating layer which plays a role to improve corrosion resistance and wear resistance of a material used under severe corrosive and wear conditions among iron-based metal parts of a integrated gasification combined cycle and to suppress reactivity of iron-based parts used in non-ferrous metal casting is formed, a coating layer having a compact fine microstructure in which there is little defect such as pores inside thereof should have been produced.

In order to solve these problems, the present invention further comprises a step of reducing the activity of Fe on the surface of iron-based metal so as to inhibit the generation of iron-based resulting gas by the use of a pack cementation process before the step of forming a coating layer having a composition of cobalt-iron on the surface of iron-based metals. For example, the present invention is characterized by further comprising a step of forming an iron boride coating layer.

According to the present invention, for the formation of a cobalt-iron layer, an iron boride (FeB, $Fe_2B$) thin layer is formed on the surface of an iron-based part by boronizing it for a short period of time by using a pack cementation process, and cobalt is deposited thereon by using a pack cementation process, which results in the formation of a coating layer as a compact Co—Fe alloy layer. After that, the cobalt-iron layer is boronized by using a pack cementation process, to thereby form a cobalt boride ($Co_2B$) coating layer having a compact fine structure in which there is little defect such as pores inside thereof.

In the step of forming an iron boride coating layer according to the present invention, for reducing the activity of Fe at the surface of an iron-based metal basic material by using a pack cementation process, it is preferred that the iron-based basic material is charged into the inside of a boron pack powder, for example, having a composition of 1~50 wt % of $B_4C$, 1~10 wt % of $KBF_4$ and 40~98 wt % of SiC, subjected to boronization under argon atmosphere and chilled, to thereby form an iron boride (FeB, $Fe_2B$) thin layer having a thickness of about 5~15 μm. Here, the boronization for the formation of an iron boride coating layer is carried out at 600~1000° C. for 5~60 min, which is preferable to efficiently suppress the generation of iron-based resulting gas and form a thin layer having a compact fine structure and an additional coating layer.

Like this, when the surface of an iron-based metal basic material is deposited with cobalt by using the cobalt reacting gas of cobalt chloride generated by using the above pack powder being subjected to the pack cementation process, the present invention is characterized by comprising the method of forming an iron boride thin layer which can reduce the activity of Fe at the surface of the basic material such that the generation of iron-based resulting gas from iron chloride through the substitution with Fe at the surface of the iron-based metal basic material is suppressed.

According to this method of the present invention, a Co—Fe coating layer having a compact fine structure in which there is little defect such as pores inside thereof during the deposition of cobalt by using a pack cementation process can be formed, which results in forming an outmost layer as a cobalt boride coating layer with superior wear resistance and corrosion resistance at the surface of the iron-based metal basic material.

In the step of forming an outmost layer having a composition of cobalt boride by using a pack cementation process, after the formation of a Co—Fe coating layer by using a pack cementation process as described above, in order to form a Co—Fe coating layer having a compact fine structure on the surface of an iron-based basic material, the pack powder is subjected to boronization, which results in forming a Co—Fe coating layer having a compact fine structure in which there is little defect such as pores inside thereof.

The iron-based metal part including the cobalt-iron coating layer formed according to the method of the present invention can comprise a coating layer having a fine structure which is comprised of an outmost layer of Fe (2~8 wt %) and Co (92~98 wt %) and an inner layer of Fe (42~75 wt %) and Co (5~825 wt %).

When the method for forming a coating layer according to the present invention is applied, a composite coating layer composed of an outmost layer having a composition of cobalt boride and an inner layer having a composition of iron-cobalt boride is formed on the surface of an iron-based metal, which results in manufacturing an iron-based metal part with improved durability. Such a method for forming a coating layer according to the present invention can be effectively used to improve performance (e.g., corrosion resistance, wear resistance, oxidation resistance) of a heat exchanger, a filter, a turbine and other iron-based metal parts among them of an integrated gasification combined cycle.

Therefore, the present invention includes an iron-based metal part with improved durability in which the surface of the iron-based metal is coated with a composite coating layer composed of an outmost layer having a composition of cobalt boride and an inner layer having a composition of iron-cobalt boride.

According to the method of the present invention for forming a coating layer by using a pack cementation process, the process of manufacturing a coating layer is simple and economical, and has an advantage of being increased interface binding strength between a basic material and a coating layer. Thus, it is possible to form a cobalt boride coating layer with superior corrosion resistance and wear resistance on the surface of iron-based metal, which results from a fine compact structure thereof in which there is little defect such as pores inside.

Further, in case of forming a Co—Fe alloy layer by depositing cobalt on the surface of an iron-based basic material by using a pack cementation process according to the present invention, because the activity of Fe at the surface thereof is decreased by forming a thin iron boride coating layer through boronizing treatment, it is possible to form a Co—Fe alloy coating layer having a fine composite structure by suppressing a substitution reaction with Fe during the cobalt deposition at the surface of the basic material from cobalt chloride reacting gas.

The present invention is further illustrated by the following examples. However, it shall be understood that these examples are only used to specifically set forth the present invention, rather than being understood that they are used to limit the present invention in any form.

Example 1

SCM440 (comprising 0.43% of C, 0.35% of Si, 0.85% of Mn, 0.03% of P, 0.03% of S, 1.2% of Cr, 0.3% of Mo, 0.25% of Ni, and 0.3% of Cu-bal Fe) iron-based alloys was used as a basic material sample, in which the SCM440 sample was prepared in the size of 20 mm×20 mm×2 mm.

The SCM440 sample was grinded with a silicon carbide (SiC) abrasive paper #1200, and washed in an ultrasonic washer with acetone, alcohol and distilled water in order each for 30 min so as to remove organic materials existed at the surface thereof. After drying, the SCM440 sample was used as a basic material for the formation of a coating layer.

In order to decrease the activity of Fe at the surface of an iron-based basic material by using a pack cementation process, the iron-based basic material was charged into the inside of a pack powder for boronizing treatment which was composed of 5% of $B_4C$, 5% of $KBF_4$ and 90% of SiC, boronized at 900° C. for 20 min under argon atmosphere, and subjected to furnace cooling, to thereby manufacture a thin layer having a thickness of about 10 μm and being composed of iron boride (FeB, $Fe_2B$).

In order to deposit cobalt on the surface of the boronized iron-based material by using a pack cementation process, after weighing the pack powders and mixing as a composition ratio of 10% of Co, 5% of $NH_4Cl$, and 85% of $Al_2O_3$, it was charged into the homogeneously mixed pack powder, deposited with cobalt at 900° C. for 5 hr under argon atmosphere, and subjected to furnace cooling, to thereby manufacture a Co—Fe alloy layer.

The Co—Fe alloy coating layer with a fine compact structure having no pore and defect within the inside thereof through the deposition of cobalt by using a pack cementation process was manufactured. After that, the iron-based basic material was charged again into a pack powder for boronizing treatment which was composed of 5% of $B_4C$, 5% of $KBF_4$, and 90% of SiC, boronized at 900° C. for 3 hr under argon atmosphere, and subjected to furnace cooling, to thereby manufacturing a final coating layer composed of cobalt boride ($Co_2B$).

Comparative Example 1

This Example was carried out according to the same method as described in Example 1 except that the thin layer composed of iron boride was not formed.

Comparative Example 2

This Example was carried out according to the same method as described in Comparative Example 1 except that after the formation of a porous Co—Fe coating layer, the coating layer was boronized at 5 hr under the same condition.

Test Example

Figure 2:
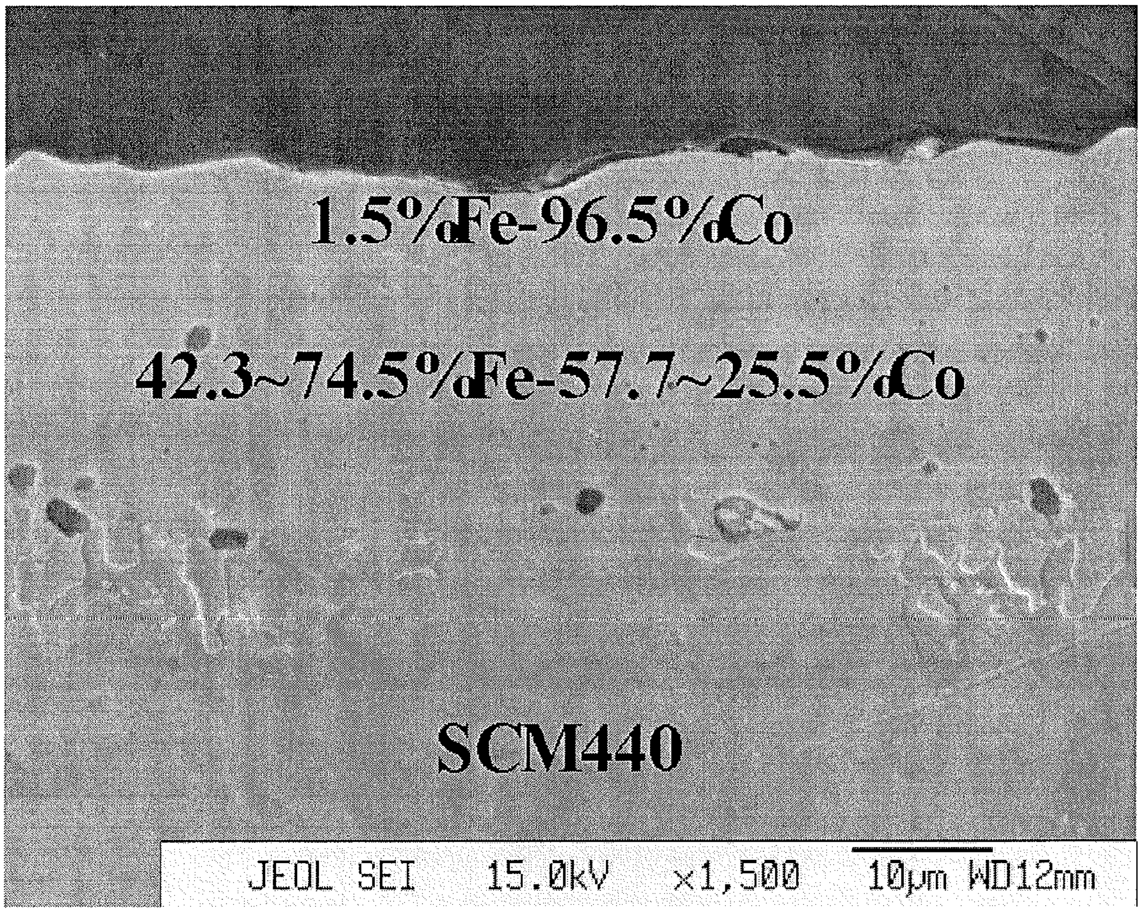
FIG. 2 is a photograph showing the cross section of a coating layer with a scanning electron microscope, which is prepared in Example 1 by boronizing the surface of SCM440 alloy and depositing cobalt thereon by using a pack cementation process.

FIG. 2 is a photograph showing the cross section of the coating layer with a scanning electron microscope, which is prepared in Example 1 by forming iron boride on the surface of SCM440 followed by depositing cobalt thereon by using a pack cementation process. As a result of analyzing the composition of the coating layer according to a WDS (wave dispersive spectroscopy) method, the coating layer was composed of an outmost layer having a composition of 1.5% of Fe and 96.5% of Co (hereinafter, weight ratio) and an inner layer having a composition of 42.3~74.5% of Fe and 57.7~25.5% of Co. Further, it was found that the coating layer had a compact fine structure in which there was little defect such as pores inside thereof.

Figure 3:
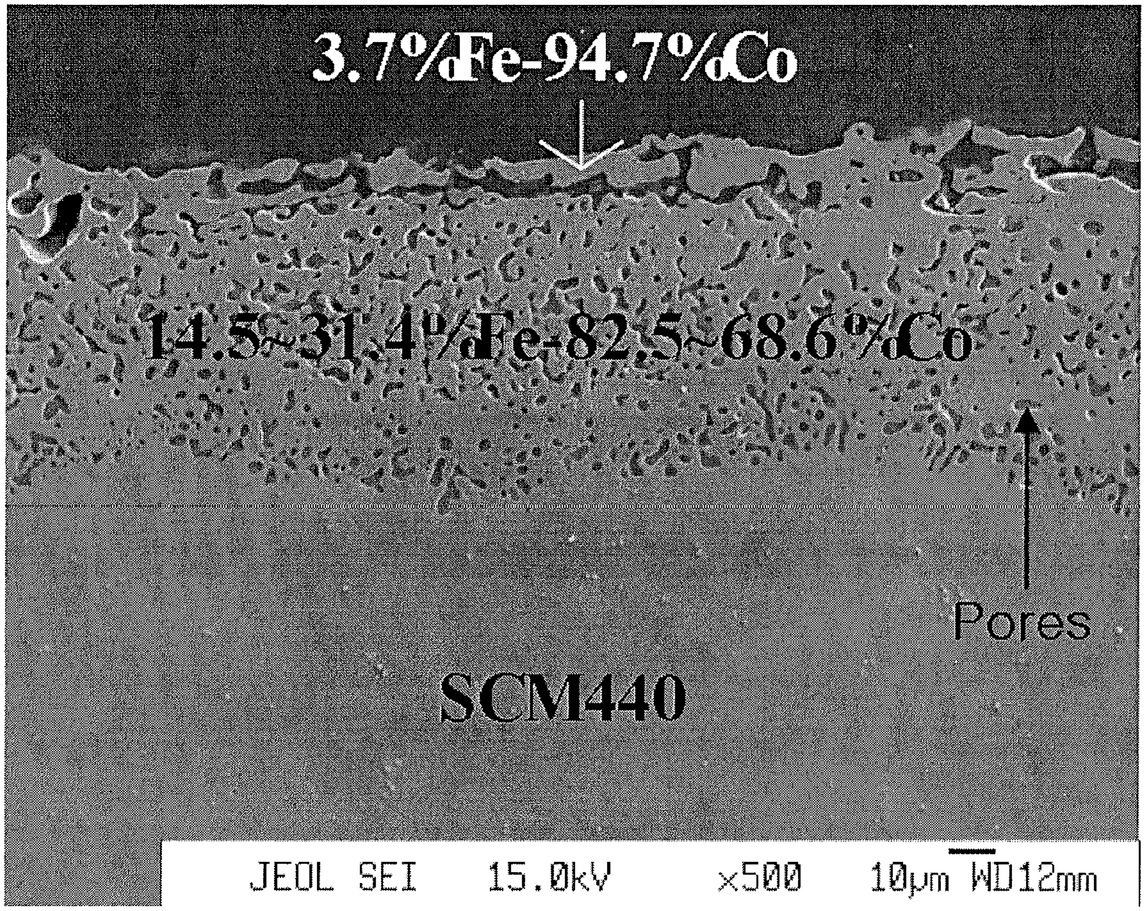
FIG. 3 is a photograph showing the cross section of a coating layer with a scanning electron microscope, which is prepared in Comparative Example 1 by directly depositing cobalt on the surface of SCM440 alloy by using a pack cementation process.

FIG. 3 is a photograph showing the cross section of the coating layer with a scanning electron microscope, which is prepared in Comparative Example 1 by depositing cobalt on the surface of SCM440 by using a pack cementation process. As a result of analyzing the composition of the coating layer according to a WDS method, the coating layer was composed of an outmost layer having a composition of 3.7% of Fe and 94.7% of Co and an inner layer having a composition of 14.5~31.4% of Fe and 82.5~68.6% of Co. However, the coating layer had a porous fine structure in which a lot of pores were formed inside thereof and many horizontal cracks were existed at the boundary of the outmost layer and inner layer.

Therefore, these results suggest that in order to suppress the generation of iron chloride gas caused by the substitution reaction with Fe at the surface of the basic material when cobalt is deposited on the surface of an iron-based basic material by using a pack cementation process, and thereby manufacture a coating layer having a fine compact structure in which there was little defect such as pores inside thereof, it is necessary to decrease the activity of Fe at the surface of the basic material, and it is preferable to conduct the boronizing treatment for a short period of time by using a pack cementation process as provided in the above Example.

Figure 4A:
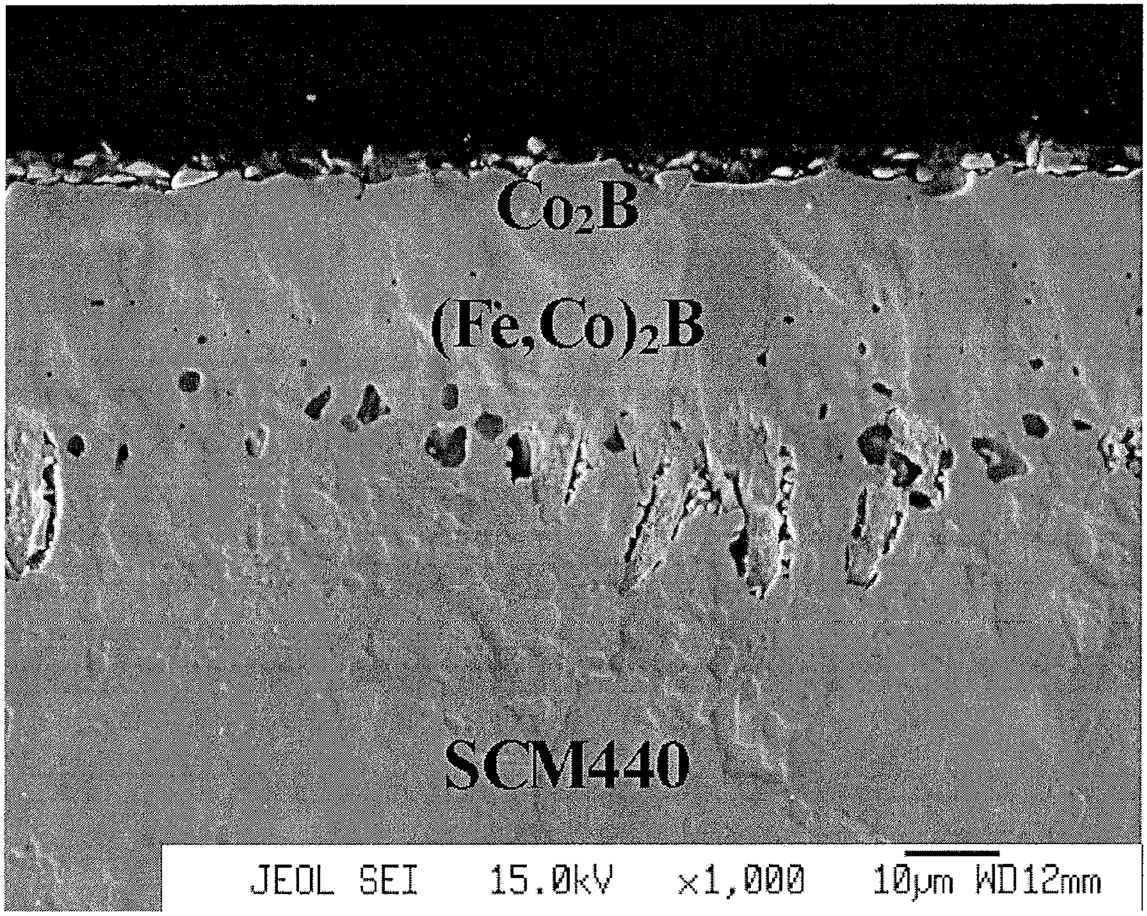
FIG. 4*a* is a photograph showing the cross section of a coating layer with a scanning electron microscope, which is prepared by boronizing the coating layer formed according to the same conditions as described in FIG. 2.
Figure 4B:
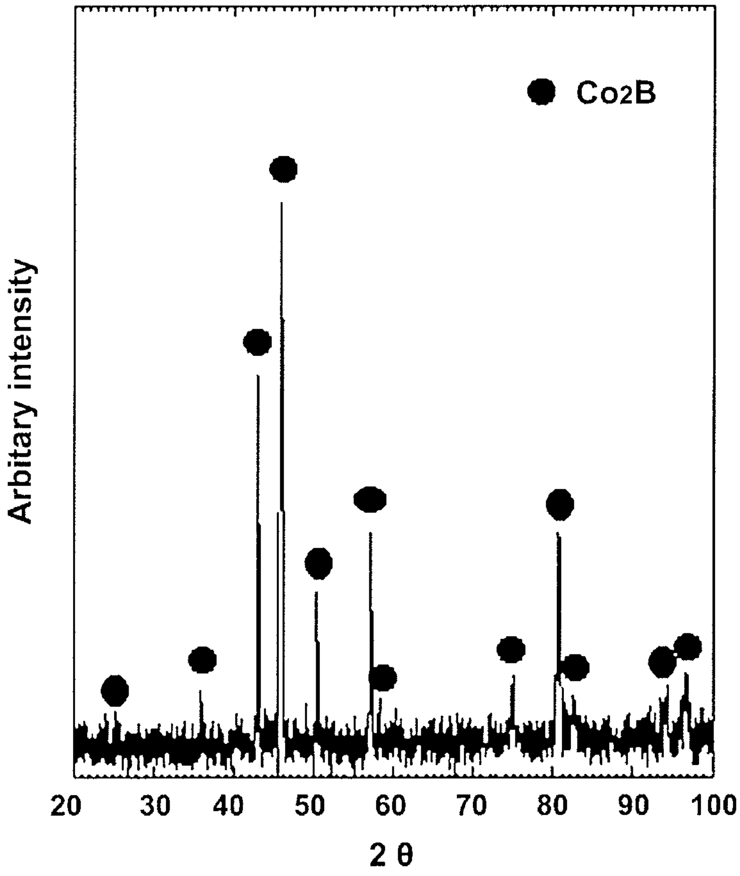
FIG. 4*b* is the result of X-ray diffraction pattern taken from the surface of the coating layer formed according to the same conditions as described in FIG. 4*a*.

Further, FIG. 4*a* is a photograph showing the cross section of the coating layer which is prepared in Example by forming iron boride on the surface of SCM440, depositing cobalt thereon by using a pack cementation process, and boronizing the resulting basic material with a pack powder for boronizing treatment, and FIG. 4*b* is the result of analyzing the surface of the coating layer with an X-ray spectrometer.

As a result, it was confirmed that the coating layer was composed of an outmost layer having a composition of $Co_2B$ and an inner layer having a composition of $(Fe,Co)_2B$, and had a fine compact structure in which there was little defect such as pores inside thereof.

Figure 4C:
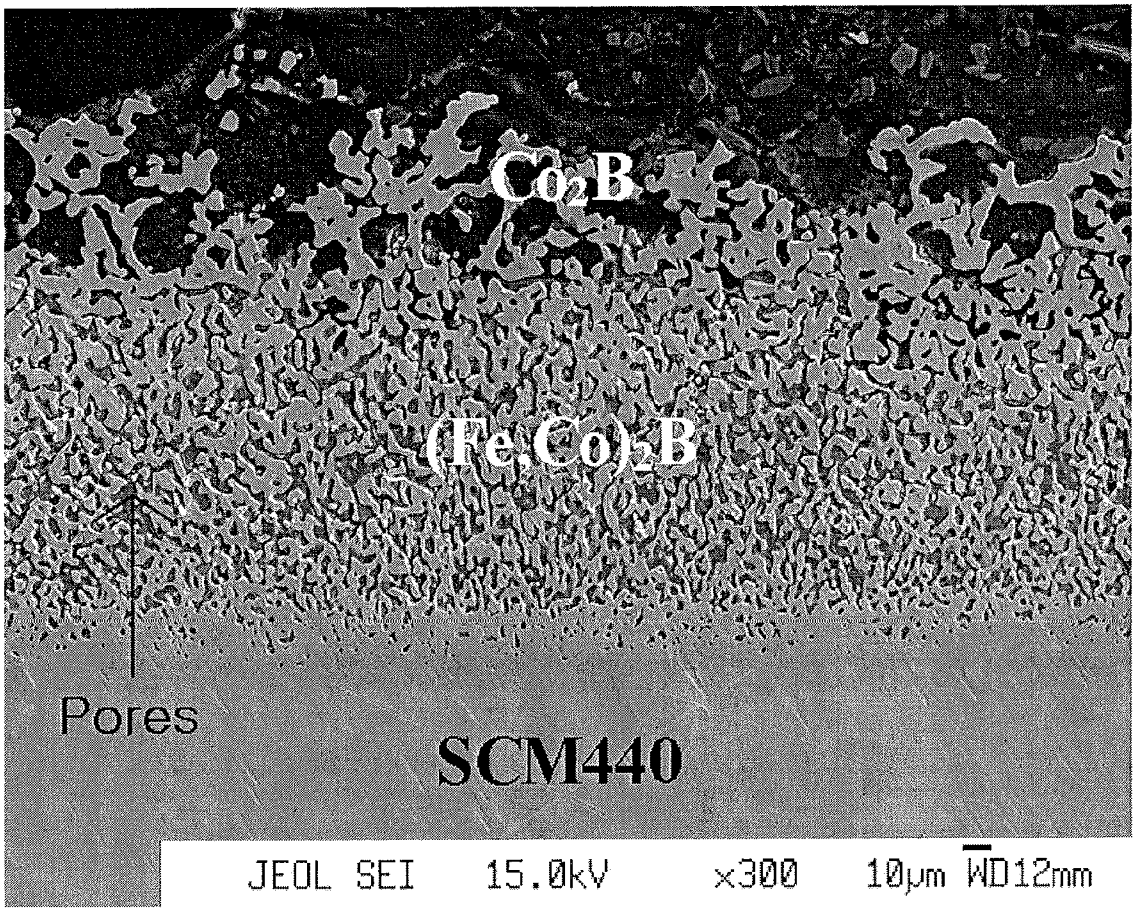
FIG. 4*c* is a photograph showing the cross section of the coating layer with a scanning electron microscope, which is prepared by boronizing the coating layer formed according to the same conditions as described in FIG. 3.

Meanwhile, FIG. 4*c* is a photograph showing the cross section of the coating layer which is prepared by depositing cobalt on the surface of SCM440 by using a pack cementation process according to Comparative Example 1, charging it into the pack powder for boronizing treatment having the same composition as Example 1, coating it for 5 hr under the same condition and furnace cooling. It was found that the coating layer was composed of an outmost layer and an inner layer having the same compositions, respectively, but it had a porous fine structure in which numerous pores were formed inside thereof.

From these results, it was confirmed that the method for manufacturing a coating layer on the surface of an iron-based metal by using a pack cementation process according to the present invention can more effectively and simply manufacture a coating layer having a fine composite structure than conventional methods. Further, in case of forming an iron boride coating layer as a pre-treatment process, it is possible to form a coating layer having superior physical properties.

What is claimed is:

1. A method for manufacturing a cobalt boride coating layer on the surface of iron-based metals, comprising:

forming a thin layer composed of iron borides on the surface of iron-based metals by using a pack cementation process;

forming a layer composed of cobalt-iron on the surface of iron-based metals by using a pack cementation process on the iron borides; and forming an outmost layer composed of cobalt boride and an inner layer composed of iron-cobalt boride by using a pack cementation process on the cobalt-iron layer.

2. The method according to claim 1, which further comprises decreasing the activity of Fe so as to suppress the generation of iron-based gas during the deposition of cobalt using the pack cementation.

3. The method according to claim 1 or 2, which utilizes a pack powder for cobalt treatment which is composed of 2~60 wt % of cobalt powder, 1~10 wt % of $NH_4Cl$ powder and 30~97 wt % of $Al_2O_3$ powder.

4. The method according to claim 2, wherein the step of decreasing the activity of Fe is to form an iron boride thin layer.

5. The method according to claim 4, which utilizes a pack powder for boron treatment which is composed of 1~50 wt % of $B_4C$, 1~10 wt % of $KBF_4$ and 40~98 wt % of SiC.

6. The method according to claim 4, wherein the iron boride thin layer is formed by boronizing at 600~1000° C. for 5~60 min.

7. The method according to claim 1, wherein the cobalt boride coating layer is formed as an outmost layer composed of $Co_2B$ and an inner layer composed of $(Fe,Co)_2B$.

8. The method according to claim 4, wherein the iron boride thin layer is formed as a coating layer composed of FeB, $Fe_2B$ or a mixture thereof.

* * * * *